(12) United States Patent
Volpert et al.

(10) Patent No.: US 11,626,548 B2
(45) Date of Patent: Apr. 11, 2023

(54) METHOD FOR TRANSFERRING LIGHT-EMITTING STRUCTURES

(71) Applicants: COMMISSARIAT À L'ÉNERGIE ATOMIQUE ET AUX ÉNERGIES ALTERNATIVES, Paris (FR); ALEDIA, Grenoble (FR)

(72) Inventors: Marion Volpert, Sassenage (FR); Vincent Beix, Fontaine (FR); François Levy, Claix (FR); Mario Ibrahim, Fontaine (FR); Fabrice De Moro, Saint Marcellin (FR)

(73) Assignees: ALEDIA, Grenoble (FR); COMMISSARIAT À L'ÉNERGIE ATOMIQUE ET AUX ÉNERGIES ALTERNATIVES, Paris (FR)

( * ) Notice: Subject to any disclaimer, the term of this patent is extended or adjusted under 35 U.S.C. 154(b) by 267 days.

(21) Appl. No.: 16/954,891

(22) PCT Filed: Dec. 17, 2018

(86) PCT No.: PCT/FR2018/053321
§ 371 (c)(1),
(2) Date: Jun. 17, 2020

(87) PCT Pub. No.: WO2019/122644
PCT Pub. Date: Jun. 27, 2019

(65) Prior Publication Data
US 2020/0403130 A1   Dec. 24, 2020

(30) Foreign Application Priority Data

Dec. 22, 2017 (FR) .................................. 1763169

(51) Int. Cl.
*H01L 33/60* (2010.01)
*H01L 27/15* (2006.01)
(Continued)

(52) U.S. Cl.
CPC ............ *H01L 33/60* (2013.01); *H01L 27/156* (2013.01); *H01L 33/005* (2013.01);
(Continued)

(58) Field of Classification Search
CPC . H01L 25/0753; H01L 27/156; H01L 33/005; H01L 33/0093; H01L 33/08; H01L 33/46; H01L 33/48; H01L 33/60
See application file for complete search history.

(56) References Cited

U.S. PATENT DOCUMENTS 10,580,931 B2   3/2020   Robin et al.
2006/0284190 A1   12/2006   Zimmerman et al.
(Continued)

FOREIGN PATENT DOCUMENTS

| FR | 2992465 A1 | 12/2013 |
| FR | 3012676 A1 | 5/2015 |
| WO | 2017216445 A1 | 12/2017 |

OTHER PUBLICATIONS

Maszara, W.P. et al. "Bonding of silicon wafers or silicon-on-insulator", Journal of Applied Physics, Nov. 15, 1988, vol. 64, No. 10, pp. 4943-4950.
(Continued)

*Primary Examiner* — Matthew C Landau
*Assistant Examiner* — Dmitriy Yemelyanov
(74) *Attorney, Agent, or Firm* — Pearne & Gordon LLP

(57) ABSTRACT

A method for transferring electroluminescent structures onto a face, referred to as the accommodating face, of an accommodating substrate. The accommodating face is moreover provided with interconnections intended to individually address each of the structures. The electroluminescent structures are initially formed on a supporting substrate and are separated by tracks. It is then proposed in the present invention to form reflective walls, vertically above the
(Continued)

tracks, which comprise a supporting polymer (the second polymer) supporting a metal film on its sides. Such an arrangement of reflective walls makes it possible to reduce the stresses exerted on the electroluminescent structures during the transfer method according to the present invention. Moreover, the reflective walls, within the meaning of the present invention, may be produced on all the electroluminescent structures resting on a supporting substrate.

20 Claims, 4 Drawing Sheets

(51) Int. Cl.
    *H01L 33/00*     (2010.01)
    *H01L 33/08*     (2010.01)
    *H01L 33/48*     (2010.01)

(52) U.S. Cl.
    CPC .......... *H01L 33/0093* (2020.05); *H01L 33/08* (2013.01); *H01L 33/48* (2013.01)

(56) References Cited

U.S. PATENT DOCUMENTS

| | | |
|---|---|---|
| 2008/0210955 A1* | 9/2008 | Uemura .............. H01L 33/0093 |
| | | 257/E33.023 |
| 2015/0155331 A1 | 6/2015 | Guenard |
| 2016/0270176 A1 | 9/2016 | Robin et al. |
| 2017/0301660 A1* | 10/2017 | Pokhriyal ............. H01L 25/167 |
| 2020/0035864 A1 | 1/2020 | Chambion et al. |
| 2021/0104649 A1* | 4/2021 | Herrmann ............... H01L 33/24 |

OTHER PUBLICATIONS

Specification and drawings for U.S. Appl. No. 16/851,165 entitled "Method for Producing a Phpto-Emitting and/or Photo-Receiving Device Wiht a Metal Optical Separation Grid", filed Apr. 17, 2020.
International Search Report for PCT/FR2018-053321 dated Mar. 14, 2019.
Written Opinion for PCT/FR2018-053321 dated Mar. 14, 2019.
French Search Report for French application No. 1763169 dated Sep. 14, 2018.

* cited by examiner

METHOD FOR TRANSFERRING LIGHT-EMITTING STRUCTURES

CROSS-REFERENCE TO RELATED APPLICATIONS

This is a National Stage of PCT international application PCT/FR2018/053321, filed on Dec. 17, 2018, which claims the priority of French Patent Application No. 1763169, filed Dec. 22, 2017, both of which are incorporated herein by reference in their entirety.

TECHNICAL FIELD

The present invention relates to a method for transferring electroluminescent structures. In particular, the present invention relates to a method for transferring electroluminescent structures involving the prior formation of reflective walls intended to optically isolate the electroluminescent structures from each other.

PRIOR ART

One method, known from the prior art, for transferring electroluminescent structures formed on a so-called front face of a supporting substrate and separated from each other by tracks, comprises the following steps:

a) a step of forming metal walls, in particular thick metal walls with a reflective surface, directly above the tracks, said metal walls delimiting the electroluminescent structures from each other;

b) a step of assembling the supporting substrate and a temporary substrate;

c) a step of at least partial thinning of the supporting substrate;

d) a step of transferring the electroluminescent structures onto the accommodating substrate, said substrate comprising interconnection means intended to individually address each of the electroluminescent structures.

At the end of step d), the electroluminescent structures are in contact with the interconnection means through one of their faces, referred to as the rear face.

The electroluminescent structures may comprise light emitting diodes able to emit light radiation through one of their faces, referred to as the free face, and opposite to the rear face.

The light emitting diodes may be 2D, namely planar, light emitting diodes, and thus comprise a stack of semiconductive films.

Alternatively, the light emitting diodes may be 3D light emitting diodes each comprising a plurality of electroluminescent nanowires perpendicular to the free face.

However, this known manufacturing method of the prior art is not satisfactory.

This is because the formation of metal walls, which generally involves a deposition of a thick layer of a metal species, for example by electrodeposition, gives rise to high stresses that may lead to the degradation or even the destruction of the electroluminescent structures.

The degradation of the electroluminescent structures may result for example in the appearance of cracks at the free face thereof for example.

One aim of the present invention is therefore to propose a method for transferring electroluminescent structures delimited by metal walls, the formation of which causes few or no stresses liable to degrade said structures.

Another aim of the present invention is to propose a method for transferring electroluminescent structures for which the metal walls are produced before the transfer of said structures, and therefore advantageously on a substrate provided with a plurality of electroluminescent structures.

DISCLOSURE OF THE INVENTION

The aims of the invention are at least partly achieved by a method for transferring electroluminescent structures formed on a face, referred to as the front face, of a supporting substrate and separated from each other by tracks, the method comprising the following successive steps:

a) formation of an intermediate layer provided with first regions, made from a first material covering a face, referred to as the electroluminescent face, of the electroluminescent structures, and reflective walls formed in trenches above the tracks and separating said first regions, said walls comprising a metal film covering at least the sides of the trenches as well as a second material covering the metal film and filling in said trenches;

b) assembling the intermediate layer and a face, referred to as the temporary face, of a temporary substrate;

c) at least partial removal of the supporting substrate;

d) transfer of the electroluminescent structures onto a face, referred to as the accommodating face, of the accommodating substrate, one or other of the first and second being intended to provide adhesion between the intermediate layer and the temporary face.

According to one embodiment, the relative difference between the thermal expansion coefficient of the second material and that of the supporting substrate is less than 20%.

According to one embodiment, one or other of the first and second materials comprises a thermoplastic polymer intended to provide adhesion between the intermediate layer and the temporary face.

According to one embodiment, the other one of the first and second materials comprises a thermosetting polymer.

According to one embodiment, the first and second materials are polyimides.

According to one embodiment, the first and second materials have a glass transition temperature between 150° C. and 450° C., advantageously between 250° C. and 450° C.

According to one embodiment, step b) comprises the following steps:

b1) putting the intermediate layer in contact with the temporary face, b2) heat treatment of the assembly thus formed at a temperature of less than 500° C., advantageously less than 300° C.

According to one embodiment, step a) comprises the following steps:

a1) formation of the first regions, a2) formation of the metal film that comprises the deposition of a metal layer covering the first regions and the bottom and sides of the trenches, a3) filling of the trenches with the second material.

According to one embodiment, step a1) comprises the formation of a first layer made from the first material, followed by the definition of the first regions in said layer, advantageously the definition of the first regions comprising a photolithography step.

According to one embodiment, step a3) comprises the formation of a second layer, made from a second material, covering the first regions and filling the trenches.

According to one embodiment, step c) comprises a mechanical thinning executed by abrasion.

According to one embodiment, step c) is followed by a step c1) of formation of metal contacts on the electroluminescent structures, the accommodating face further comprising interconnection means intended to cooperate with the metal contacts and thus to individually address each of the electroluminescent structures.

According to one embodiment, the transfer step d) comprises the steps of:

d1) formation of an assembly comprising the accommodating substrate and the temporary substrate, the electroluminescent structures being interposed between said substrates;

d2) removal of the temporary substrate, advantageously by mechanical thinning or by laser detachment.

According to one embodiment, the method comprises a step a4) of partial removal of the second layer and of the metal layer, the partial removal step being executed so as to preserve the reflecting walls.

According to one embodiment, the second material is thermoplastic polymer and step a4) is executed either before step b) or after step d).

According to one embodiment, the second material is thermosetting polymer and step a4) is executed before step b).

According to one embodiment, the electroluminescent structures each comprise an active layer interposed between a first layer of semiconductor and a second layer of semiconductor.

According to one embodiment, each electroluminescent structure comprises a plurality of nanowires perpendicular to the electroluminescent face.

According to one embodiment, the electroluminescent structures are arranged in a matrix fashion.

According to one embodiment, step d) is followed by a step e) of removal of the first regions and preserving the reflective walls, intended to bare the electroluminescent faces.

BRIEF DESCRIPTION OF THE DRAWINGS

Other features and advantages will emerge from the following description of the method for transferring electroluminescent structures according to the invention, given by way of non-limitative examples with reference to the accompanying drawings, in which.

DETAILED DISCLOSURE OF PARTICULAR EMBODIMENTS

The invention described in detail below implements a method for transferring electroluminescent structures onto a face, referred to as the accommodating face, of an accommodating substrate. The accommodating face is moreover provided with interconnection means intended to individually address each of said structures. The electroluminescent structures are initially formed on a supporting substrate and are separated by tracks.

It is then proposed in the present invention to form reflective walls, vertically above the tracks, which comprise a supporting polymer (the second polymer) supporting a metal film on its sides. Such a reflective-wall structure reduces the stresses exerted on the electroluminescent structures during the transfer method according to the present invention.

Moreover, the reflective walls, within the meaning of the present invention, can be produced on all the electroluminescent structures resting on a supporting substrate.

In FIGS. 1a to 1j and 2a to 2i, examples of implementation of the method for transferring electroluminescent structures 100 onto an accommodating substrate 500 can be seen.

"Electroluminescent structure" generally means a structure which, as soon as it has a current passing through it, emits light radiation.

Figure 1A:
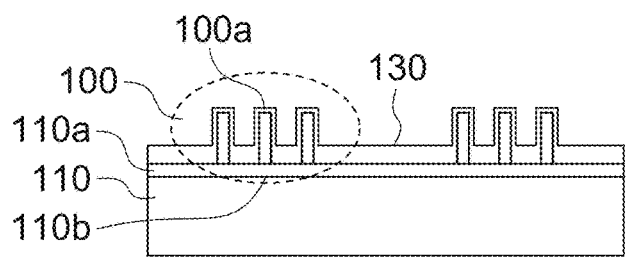
FIGS. 1a to 1j are schematic representations, along a section plane perpendicular to the front face of the supporting substrate, of the method for transferring electroluminescent structures according to a first embodiment of the present invention.
Figure 2A:
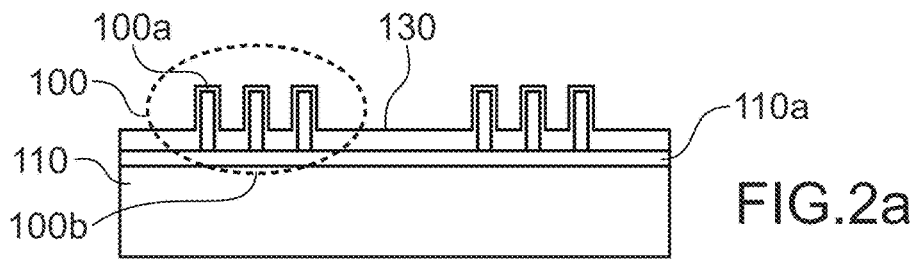
FIGS. 2a to 2i are schematic representations, along a section plane perpendicular to the front face of the supporting substrate, of the method for transferring electroluminescent structures according to a second embodiment of the present invention.

In this regard, the electroluminescent structures 100 are able to emit the light radiation through their electroluminescent face 100a (FIGS. 1a and 2a).

"Light radiation" means for example radiation in a range of wavelengths in the visible domain, for example in a range of wavelengths lying between 400 µm and 700 µm.

Figure 1B:
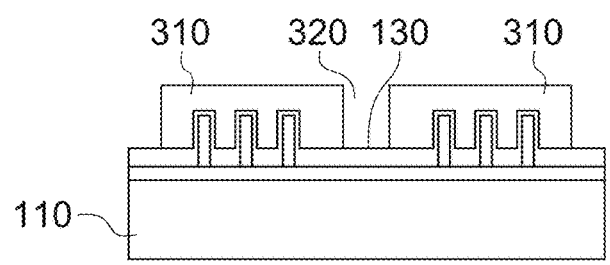
Figure 1C:
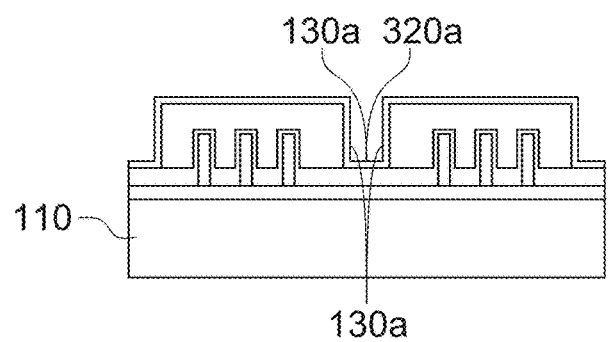
Figure 2B:
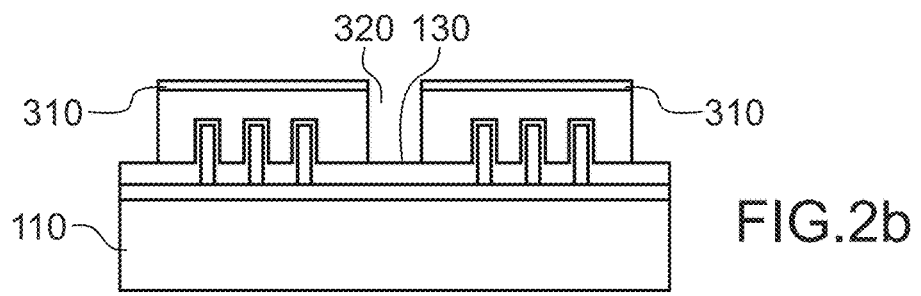

The electroluminescent structures 100 are formed on a face, referred to as the front face 110a, of a supporting substrate 110, and separated from each other by tracks 130 (FIGS. 1b and 2b).

"Track" means bands of a predetermined width, for example between 1 µm and 50 µm, advantageously between 5 µm and 10 µm, and delimiting the electroluminescent structures 100.

The electroluminescent structures 100 comprise a face opposite to the electroluminescent face 100a, and referred to as the rear face 100b (FIGS. 1a and 2a).

The electroluminescent structures 100 rest through their rear face 100b on the front face of the supporting structure 110.

According to a first alternative, the electroluminescent structures 100 may comprise an active layer interposed between a first layer of semiconductor and a second layer of semiconductor.

The first layer of semiconductor may comprise GaN of type n (type n means doped with electron-donor species).

The second layer of semiconductor may comprise GaN of type p (type p means doped with hole-donor species).

The active layer may comprise at least one of the materials chosen from: GaN, GaAs, InGaN, InGaAlP.

The active layer, the first layer of semiconductor and the second layer of semiconductor may be formed by techniques of deposition of films by epitaxy on the front face 110a of the supporting substrate 110.

The formation of said layers uses techniques known to persons skilled in the art and is therefore not described in detail in the present invention.

According to a second alternative, the electroluminescent structure 100 may comprise nanowires perpendicular to the electroluminescent face 100a.

"Microwire" or "nanowire" means a three-dimensional structure of elongate shape in a privileged direction, at least two dimensions of which, referred to as minor dimensions, are between 5 nm and 2.5 µm, preferably between 50 nm and 2.5 µm, the third dimension, referred to as the major dimension, being at least equal to 1 time, preferably at least 5 times and more preferentially at least 10 times the larger of the minor dimensions. In some embodiments, the minor dimensions may be less than or equal to approximately 1 µm, preferably between 100 nm and 1 µm, more preferentially between 100 nm and 300 nm. In some embodiments, the height of each microwire or nanowire may be greater than or equal to 500 nm, preferably between 1 µm and 50 µm.

Each nanowire may non-limitatively comprise a stack formed by an InGaN-n zone, an active zone and a GaN-p or InGaN-p zone.

In this regard, a person skilled in the art can consult the patent application [1] cited at the end of the description, and more particularly page 19 line 24 to page 20 line 10.

All the nanowires of an electroluminescent structure 100 advantageously rest on the front face 110a of the supporting substrate 110.

The plurality of luminescent structures 100 can be arranged, for example, in matrix form.

"Matrix form" means a mesh with N rows and M columns.

Each electroluminescent structure 100 is then disposed at the intersection of a row with a column of the mesh.

The method according to the invention then comprises a step a) of forming an intermediate layer 300 (FIGS. 1e and 2d) on the front face 110a of the supporting substrate 110. In other words, the intermediate layer 300 is formed so as to cover the electroluminescent structures 100 and the tracks 130.

The intermediate layer 300 comprises first regions 310, made from a first material, covering the electroluminescent face 100a and separated by trenches 320 vertically above the tracks 130 (FIGS. 1b and 2b) and in which reflective walls are formed. The width of the trenches 320 is less than or equal to the width of the tracks 130.

The first regions 310 can have a thickness of between 2 µm and 20 µm, advantageously between 5 µm and 15 µm.

The trenches 320 comprise a bottom 130a and sides 130b.

The reflective walls comprise a metal film 320a (FIGS. 1c and 2c) covering at least sides of the trenches 320, and advantageously the bottoms 130a thereof.

Figure 1D:
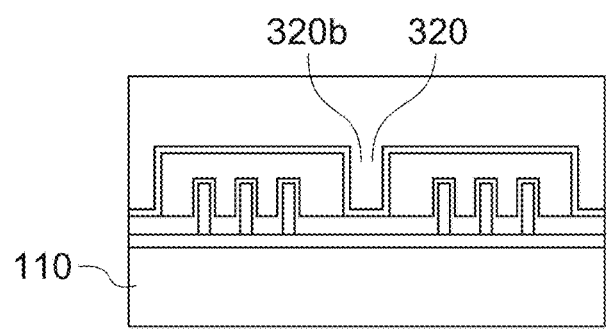
Figure 1E:
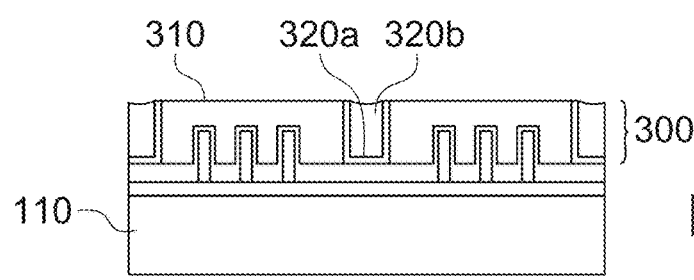
Figure 2C:
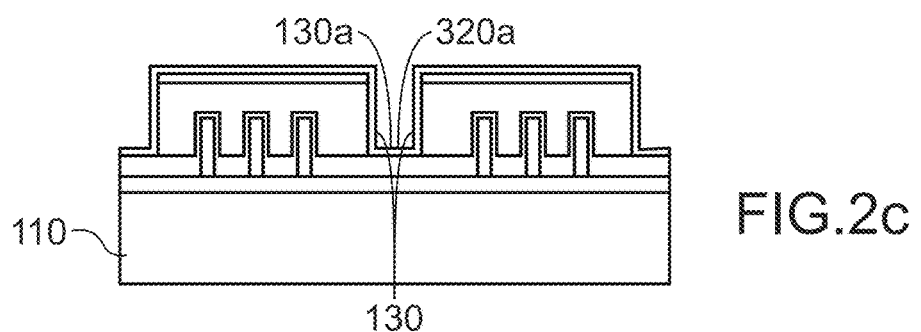
Figure 2D:
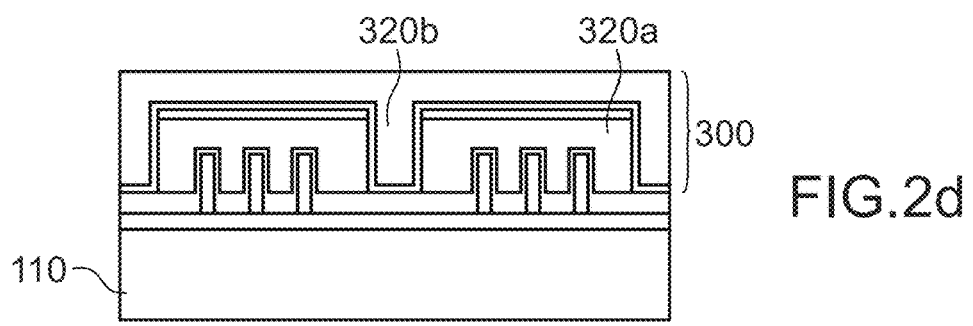

The reflective walls also comprise a second material 320b covering the metal film 320a and filling in the trenches (FIGS. 1d, 1e and 2d).

The thickness of the metal film 320a may be between 50 nm and 2 µm, preferentially between 100 nm and 300 nm.

One or other or both of the first and second materials is intended to provide adhesion between the intermediate layer 300 and a face (referred to as the temporary face 400a, of a temporary substrate 400 at the end of an assembly step b) described later in the description.

"Provide adhesion" means an assembly for which the adhesion energy is greater than 0.5 J·cm$^{-2}$.

The adhesion energy is generally measured by the Maszara technique set out in document [2] cited at the end of the description.

The thermoplastic material is intended to provide adhesion between the intermediate layer 300 and a so-called temporary face 400a of a temporary substrate 400 at the end of an assembly step b) described later in the description.

Since at least one from the first and second materials is intended to provide adhesion between the intermediate layer 300 and the temporary face 400a, it will be understood that the latter is contact with said temporary face 400 at the end of the assembly step b).

The second material may advantageously have a coefficient of thermal expansion differing by no more than 20% from that of the supporting substrate.

Depending on the various embodiments of the present invention, and in particular step a), one or other of the first and second materials may comprise a thermoplastic polymer.

In a complementary fashion, the other one of the first and second materials may comprise a thermosetting polymer.

"Thermoplastic polymer" means materials composed of linear polymer chains with few or no branched or side groups. The result is that these chains can easily slide with respect to each other when they are heated above their glass transition temperature Tg without damage for the polymer.

"Thermosetting polymer" means materials that undergo a chemical reaction when they are initially heated and hardened to form a three-dimensional crosslinked lattice. As soon as they are crosslinked, these materials have a fixed structure that cannot be modified even when they are heated to a temperature above their glass transition temperature.

Advantageously the thermoplastic and thermosetting polymers may comprise polyimides.

A thermosetting polyimide may comprise at least one of the polymers chosen from: P12611, PIQ L-100.

A polyimide intended to provide adhesion between the intermediate layer 300 and the temporary face 400a, also referred to as an adhesive polyimide, may comprise at least one of the polymers chosen from: HD3007, HD-7010.

The thermoplastic polymer may for example comprise a glue of the HD7010 or HD3007 type from the company Hitachi Chemical DuPont Microsystems. This polymer has the advantage of being photosensitive and therefore to allow definition of patterns in accordance with a photolithographic method.

The thermosetting polymer may for example comprise the compound P12611 from the company Hitachi Chemical DuPont Microsystems.

Still advantageously, the thermoplastic polymer and the thermosetting polymer may have a glass transition temperature of between 150° C. and 450° C., advantageously between 250° C. and 450° C.

Thus, according to a first embodiment of step a) (FIGS. 1b to 1e), the first material forming the first regions is intended to provide the adhesion between the intermediate layer 300 and the temporary face 400a. The first regions 310 therefore have a face exposed to the external environment at the end of step a) of formation of the intermediate layer 300 (FIG. 1e).

Advantageously, the first material may comprise a thermoplastic polymer.

Still according to this first embodiment, the second material 320b, which may comprise the thermosetting material, covers the metal film 320a and fills in the trenches 320. In particular, in order to allow adhesion between the first regions 310 and the temporary face 400a, it is understood that the second material fits flush, or even recessed, with respect to the plane formed by the faces exposed to the external environment of the first regions 310.

According to a second embodiment of step a), the second material is intended to provide the adhesion between the intermediate layer 300 and the temporary face 400a.

In this regard, the second material may comprise a thermoplastic polymer.

The first regions 310 may be made from a thermosetting polymer.

Moreover, the metal film 320a forms a continuous film that also covers the first regions 310 (FIGS. 2c and 2d).

Still according to this second embodiment, the second material 320b also forms a continuous film covering the metal film 320a.

Whatever the embodiment considered, the step a) of forming the intermediate layer 300 may comprise the following steps:

a1) formation of the first regions 310 (FIGS. 1b and 2b), a2) formation of the metal film, which comprises the deposition of a metal layer covering the first regions 310 and the bottom and sides of the trenches (FIGS. 1c and 2c), a3) filling of the trenches with the second material 320b (FIGS. 1d, 1e and 2d).

Step a1) comprises for example the formation of a first layer made from the first material, followed by the definition of the first regions 310 in said layer. The first layer may be formed for example by spreading the first material, in liquid form, on the front face 110a of the supporting substrate 110 by means of a whirler for example.

If the first material is photosensitive, the definition of the first regions may be executed by a photolithography step.

In particular, the photolithography step may comprise a step of exposure to light radiation, for example ultraviolet radiation, through a photolithographic mask of the first layer, followed by a development step intended to reveal the trenches 320.

Alternatively, the definition of the first regions 310 may comprise an etching step, for example plasma etching (in particular with an $O_2$ plasma), through a mask, referred to as a hard mask.

The hard mask may for example comprise a layer of $SiO_2$, in particular a layer of $SiO_2$ 100 nm thick.

The metal layer formed at step a2) may comprise at least one of the metal species chosen from: aluminium, silver or ruthenium, chosen for their good optical reflectivity.

Step a2) may be executed by evaporation or by bombardment of a metal target.

Step a2) may be directly followed by a step a2bis) of etching of the metal film suitable for keeping said metal layer only on the sides of the trenches. This etching step may be executed by directive plasma before implementation of step a3).

Step a3) may comprise the formation of a second layer, made from a second material, covering the first regions 310 and filling in the trenches 320.

According to the first embodiment, step a) may be followed by step a4) (FIG. 1e) of partial removal of the second layer and of the metal layer, the partial-removal step being executed so as to preserve the second material 320b and the metal film 320a in the trenches 320. Step a4) may for example be executed by chemical mechanical planarisation (CMP).

Alternatively, step a4) may comprise a step of removal of the second layer by chemical mechanical planarisation stopping on the metal layer. The metal layer covering the first regions is then etched by dry etching (for example by plasma) or by wet etching.

In a manner that is complementary to this alternative, a planarisation stop layer is formed covering the metal layer.

Figure 1F:
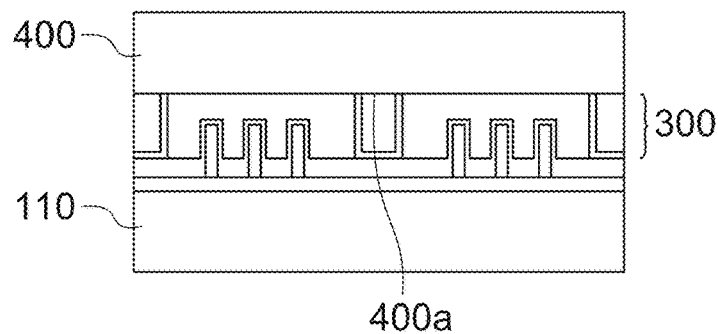
Figure 2E:
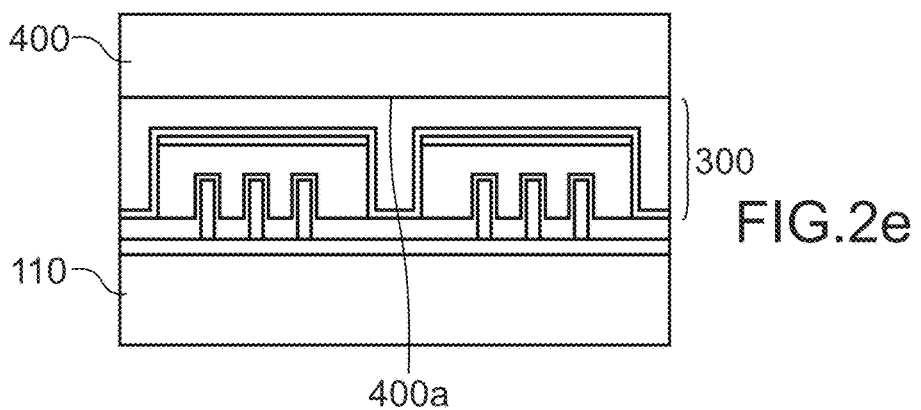

The step a) of formation of the intermediate layer 300 is then followed by a step b) of assembling the front face 110a and a face, referred to as the temporary face 400a, of a temporary substrate 400 (FIGS. 1f and 2e). In other words, the assembly step comprises putting the intermediate layer 300 in contact with the temporary face 400a. This putting in contact may be accompanied by a force exerted on each of the supporting 110 and temporary 400 substrates so as to force the adhesion between the intermediate layer 300 and the temporary face 400a.

Moreover, step b) may also comprise a heat treatment step executed at a temperature below 500° C., advantageously below 400° C., so as to reinforce the adhesion of the intermediate layer on the temporary face 400a.

The temporary substrate 400 may advantageously comprise at least one of the materials chosen from: glass, silicon, ceramic.

Figure 1G:
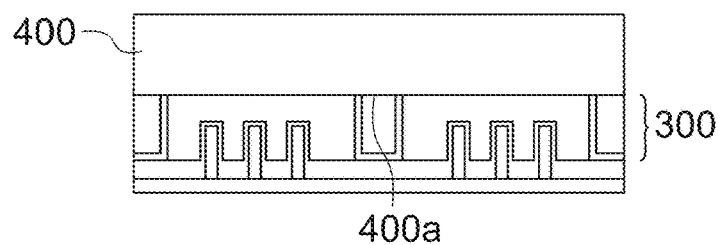
Figure 1H:
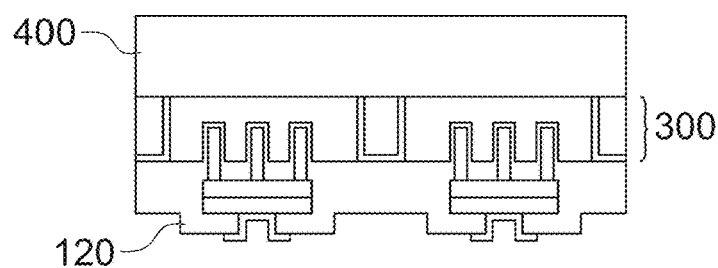
Figure 1I:
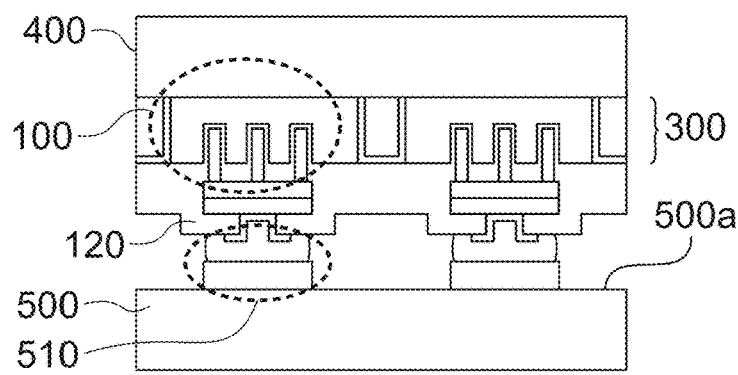
Figure 1J:
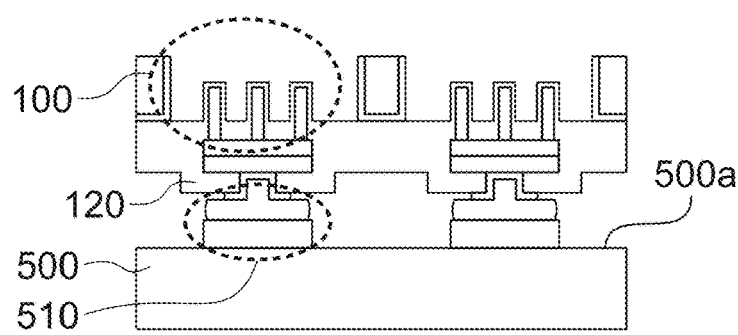
Figure 2F:
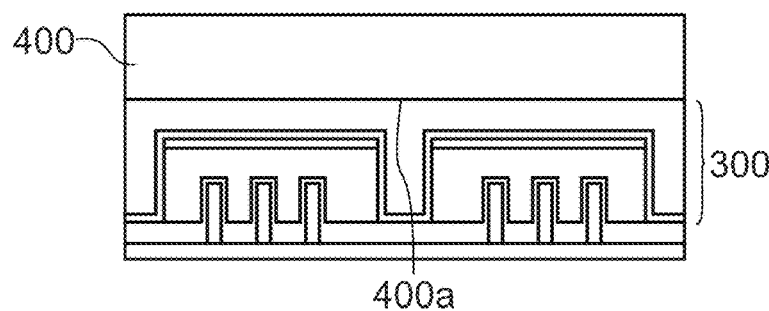
Figure 2G:
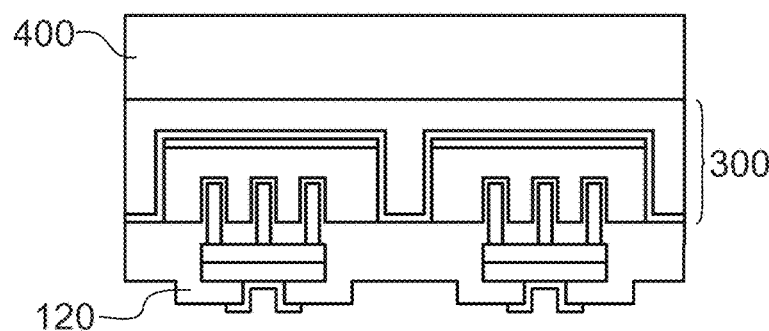
Figure 2H:
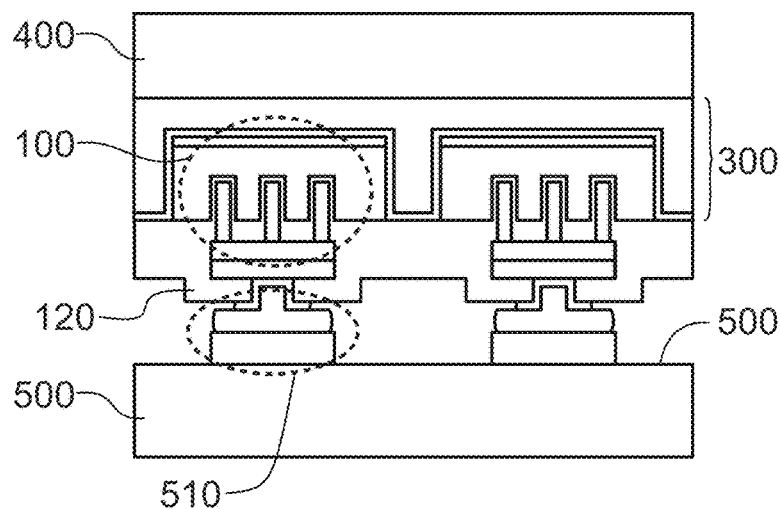
Figure 2I:
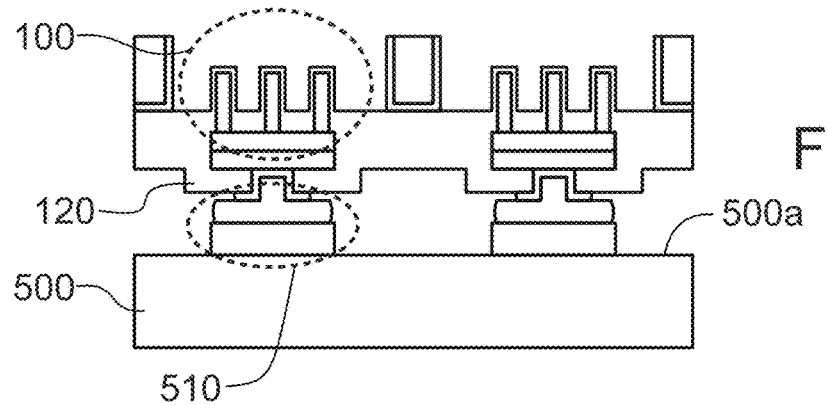

Step b) is followed by a step c) of at least partial removal or thinning of the supporting substrate 110 (FIGS. 1g and 2f).

Step c) may be executed by mechanical abrasion (grinding) and/or by liquid etching (for example with a solution of KOH or TMAH) and/or by dry etching (for example with an SF6 plasma).

Step c) may also be followed by a step c1) (FIGS. 1h and 2g) of formation of metal contacts (120) on the back of the electroluminescent structures 100 ("on the back of the structures" means on a face opposite to the electroluminescent face).

The formation of the metal contacts 120 is known to persons skilled in the art and is therefore not described in any further detail in the present invention.

Step c) is then followed by a step d) of transferring the electroluminescent structures 100 onto a face, referred to as the accommodating face 500a, of an accommodating substrate 500 (FIGS. 1i, 1j, 2h and 2i).

"Transfer of the electroluminescent structures" means a step of adhesion of the electroluminescent structures to a face of an accommodating substrate and disconnection of said structures from the temporary substrate.

In other words, at the end of step d), the electroluminescent structures 100 rest on the accommodating substrate 500.

The accommodating face 500a may further comprise interconnection means 510 intended to cooperate with the metal contact so as to individually address each of the electroluminescent structures 100.

The interconnection means 510 may comprise metal pads, for example metal pads made from a stack of titanium, nickel and gold associated with copper, tin and silver pillars.

Step d) comprises in particular a step d1) of formation of an assembly comprising the accommodating substrate 500 and the temporary substrate 400, the electroluminescent structures being interposed between said substrates.

Step d1) is then followed by a step d2) of removal of the temporary substrate.

Step d2) may be executed by mechanical thinning, for example by abrasion followed by a chemical mechanical planarisation step and/or removal by liquid method and/or by dry method.

Alternatively, the temporary substrate 400, as soon as it is transparent, may be disconnected (or detached) from the intermediate layer 300 by means of laser radiation.

At the end of step d), the electroluminescent structures 100 thus rest on the accommodating face 500a of the accommodating substrate 500.

Step d) can then be followed by a step e) of removal of the first regions preserving the reflective walls, intended to bare the electroluminescent faces.

Step e) preserves in particular reflective walls optically delimiting the electroluminescent structures from one another.

Thus, as soon as the intermediate layer is formed according to the first embodiment, step e) comprises the removal of the first regions.

The removal of the first regions may comprise etching, for example wet etching, of the first regions. In particular, the etching step may be preceded by a step of masking the reflective walls so as to protect them during said etching step.

As soon as the intermediate layer is formed according to the second embodiment, step e) comprises the thinning of the second layer.

The removal of the second layer may be executed by etching, for example by plasma etching (in particular dioxygen plasma).

Step e) also comprises the removal of the metal layer vertically above the electroluminescent structures. The removal of the metal layer may be executed with a plasma comprising for example $BCl_3$ or $Cl_2$ in the case of an aluminium layer.

Finally, step e) comprises the removal of the first regions, for example with $CF_4$ or $CHF_3$ plasma.

The present invention, in particular the formation of reflective walls, does not require the deposition of a thick metal layer liable to cause stresses that might damage or even destroy the electroluminescent structures.

Moreover, the use of the first and second polymers makes it possible to adjust the thermal expansion coefficient of the intermediate layer and also limits the generation of stress during the execution of the transfer method.

The transfer method thus proposed limits damage to the electroluminescent structures.

The reflective walls according to the present invention comprise a metal film disposed on the sides of a support formed by the second material, and require the deposition of only a small thickness of metal.

REFERENCES

[1] FR 3012676
[2] Maszara et al., "*Bonding of silicon wafers for silicon-on-insulator*", J. Appl. Phys. 64 (1 0), 15 Nov. 1988.

What is claimed is:

1. A method for transferring electroluminescent structures formed on a front face of a supporting substrate, said electroluminescent structures being separated from each other by tracks, the method comprising the following successive steps:
    a1) forming an intermediate layer provided with first regions separated by trenches therebetween, said first regions being made from a first material covering an electroluminescent face of the electroluminescent structures,
    a2) forming reflective walls on at least portions of said first regions adjacent to said trenches, said walls comprising a metal film covering at least the sides of the trenches and a second material covering the metal film and filling in said trenches;
    b) assembling the intermediate layer and a temporary face of a temporary substrate;
    c) at least partially removing the supporting substrate;
    d) transferring the electroluminescent structures onto an accommodating face of an accommodating substrate,
    at least one of the first and second materials being intended to provide adhesion between the intermediate layer and the temporary face.

2. The method according to claim 1, wherein a relative difference between the thermal expansion coefficient of the second material and that of the supporting substrate is less than 20%.

3. The method according to claim 1, wherein one or other of the first and second materials comprises a thermoplastic polymer intended to provide adhesion between the intermediate layer and the temporary face.

4. The method according to claim 3, wherein the other one of the first and second materials comprises a thermosetting polymer.

5. The method according to claim 1, wherein the first and second materials are polyimides.

6. The method according to claim 1, wherein the first and second materials have a glass transition temperature between 150° C. and 450° C.

7. The method according to claim 1, wherein step b) comprises the following steps:
    b1) putting the intermediate layer in contact with the temporary face,
    b2) heat treating the assembly thus formed at a temperature of less than 500° C.

8. The method according to claim 1, wherein step a) comprises the following steps:
    a3) forming the first regions,
    a4) forming the metal film via the deposition of a metal layer covering the first regions and at least the sides of the trenches,
    a5) filling of the trenches with the second material.

9. The method according to claim 8, wherein step a3) comprises forming a first layer made from the first material and then defining the first regions in said first layer.

10. The method according to claim 8, wherein step a5) comprises forming a second layer, made from the second material, covering the first regions and filling the trenches.

11. The method according to claim 1, wherein step c) comprises at least partially removing the supporting substrate via mechanical thinning executed by abrasion.

12. The method according to claim 1, wherein step c) is followed by a step c1) of forming metal contacts on a rear face of the electroluminescent structures, and wherein the accommodating face further comprises interconnection means intended to cooperate with the metal contacts and thus to individually address each of the electroluminescent structures.

13. The method according to claim 1, wherein the transfer step d) comprises the steps of:
    d1) forming an assembly comprising the accommodating substrate and the temporary substrate, the electroluminescent structures being interposed between said substrates;
    d2) removing the temporary substrate.

14. The method according to claim 1, wherein step a) comprises the following steps:
    a3) forming the first regions,
    a4) forming the metal film via the deposition of a metal layer covering the first regions and at least the sides of the trenches,
    a5) filling of the trenches with the second material,
    a6) partial removing the second layer and the metal layer, the partial removal step being executed so as to preserve the reflecting walls.

15. The method according to claim 14, wherein the second material is thermoplastic polymer and step a6) is executed either before step b) or after step d).

16. The method according to claim 15, wherein the second material is thermosetting polymer and step a6) is executed before step b).

17. The method according to claim 1, wherein the electroluminescent structures each comprise an active layer interposed between a first layer of semiconductor and a second layer of semiconductor.

18. The method according to claim 1, wherein each electroluminescent structure comprises a plurality of nanowires perpendicular to the electroluminescent face.

19. The method according to claim 1, wherein the electroluminescent structures are arranged in a matrix fashion.

20. The method according to claim 1, wherein step d) is followed by a step e) of removing the first regions and preserving the reflective walls, intended to bare the electroluminescent faces.

* * * * *